(12) United States Patent  
Voss

(10) Patent No.: US 9,468,116 B2  
(45) Date of Patent: Oct. 11, 2016

(54) SECURE ENCLOSURE

(71) Applicant: SEAGATE TECHNOLOGY LLC, Cupertino, CA (US)

(72) Inventor: William G. Voss, Shakopee, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/251,047

(22) Filed: Apr. 11, 2014

(65) Prior Publication Data

US 2015/0296651 A1    Oct. 15, 2015

(51) Int. Cl.  
*H05K 5/02*    (2006.01)

(52) U.S. Cl.  
CPC .................................. *H05K 5/0269* (2013.01)

(58) Field of Classification Search  
CPC ................................................... H05K 5/0269  
USPC ......................................................... 361/737  
See application file for complete search history.

(56) References Cited

U.S. PATENT DOCUMENTS

| | | | |
|---|---|---|---|
| 6,128,194 A * | 10/2000 | Francis | 361/737 |
| 6,222,122 B1 | 4/2001 | Davidson | |
| 6,533,177 B1 * | 3/2003 | Gerrits et al. | 235/487 |
| 6,556,372 B2 | 4/2003 | Hearn et al. | |
| 6,735,043 B2 | 5/2004 | Bernett et al. | |
| 6,977,337 B1 | 12/2005 | Satullo et al. | |
| 7,103,892 B2 | 9/2006 | Law | |
| 7,362,541 B2 | 4/2008 | Bernett et al. | |
| 8,358,109 B2 | 1/2013 | Gunderson | |
| 8,406,001 B2 * | 3/2013 | Chao | 361/752 |
| 2010/0177487 A1 * | 7/2010 | Arshad et al. | 361/737 |

* cited by examiner

*Primary Examiner* — Hung V Ngo  
(74) *Attorney, Agent, or Firm* — Hall Estill Attorneys at Law

(57) ABSTRACT

An apparatus and associated methodology contemplating an enclosure configured to securely contain a circuit board. The enclosure has a cover defining a flange operably extending substantially parallel to the circuit board in direct contact with the circuit board. The enclosure also has a body extending from the flange that is operably separated from the circuit board. A connecting member has opposing planar sides operably pressing to contain the flange against the circuit board in supporting the circuit board within the enclosure.

19 Claims, 5 Drawing Sheets

SECURE ENCLOSURE

SUMMARY

Some embodiments of the claimed technology contemplate an enclosure configured to securely contain a circuit board. The enclosure has a cover defining a flange operably extending substantially parallel to the circuit board in direct contact with the circuit board. The enclosure also has a body extending from the flange that is operably separated from the circuit board. A connecting member has opposing planar sides operably pressing to contain the flange against the circuit board in supporting the circuit board within the enclosure.

Some embodiments of the claimed technology contemplate an apparatus having a circuit board. A first cover has a first flange, and a second cover has a second flange. The second flange is operably crimped to contain the first flange and the circuit board within opposing sides of the second flange in order to form an enclosure supporting the circuit board within the enclosure.

Some embodiments of the claimed technology contemplate a method, including placing a first cover on a circuit board; placing a second cover on an opposing side of the circuit board; and crimping the first and second covers into a crimped connection so that the covers cooperatively form an enclosure, the first cover in the crimped connection contacting one side of the circuit board and the second cover in the crimped connection contacting the opposing side of the circuit board.

DETAILED DESCRIPTION

Initially, it is to be appreciated that this disclosure is by way of example only, not by limitation. The electronics packaging concepts herein are not limited to use or application with any specific type of electronics or associated functionality. Thus, although the instrumentalities described herein are for the convenience of explanation, shown and described with respect to exemplary embodiments, it will be appreciated that the principles herein may be applied equally in other types of systems and methods employing packaging.

Figure 1:
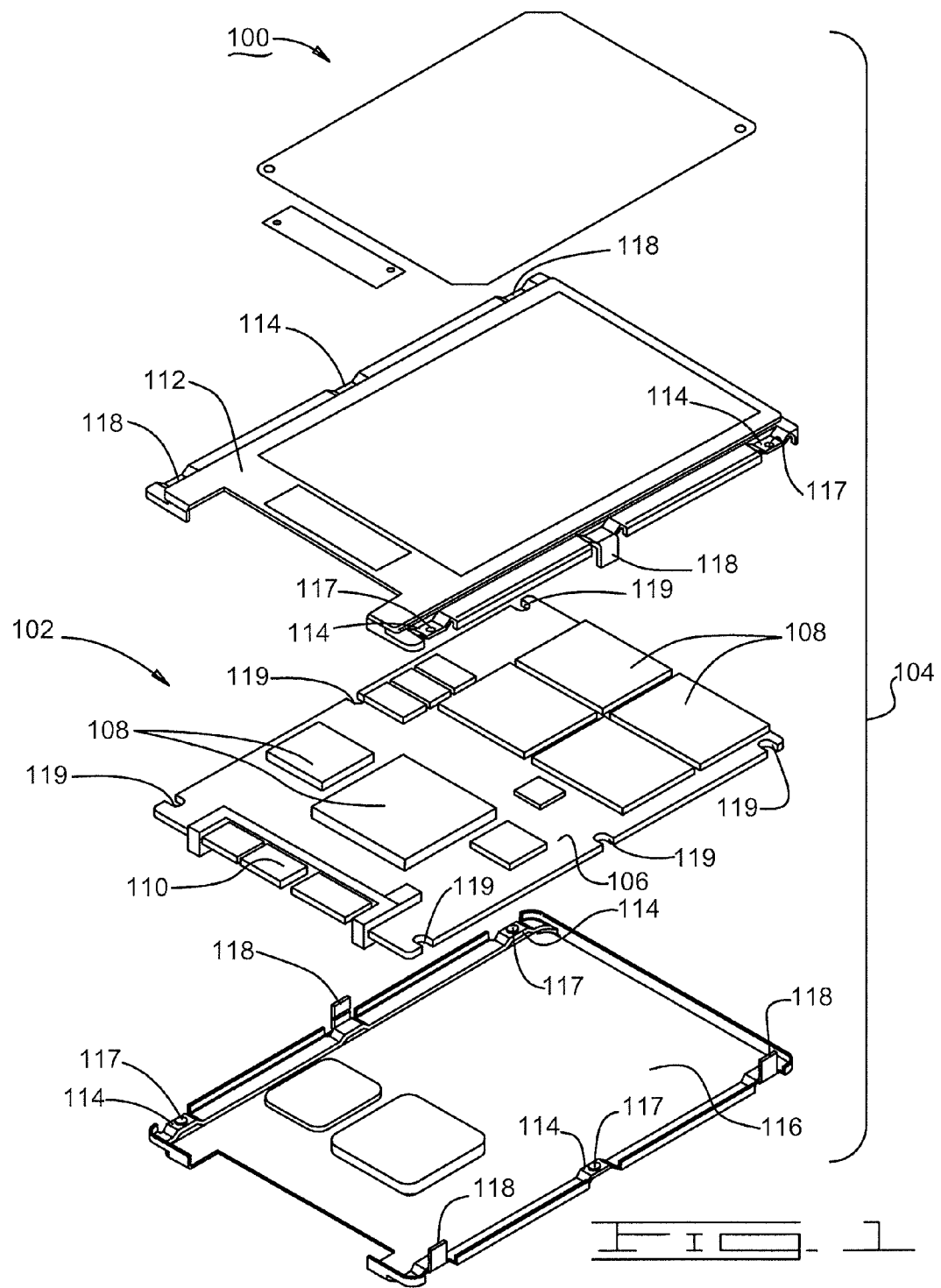
FIG. 1 is an exploded isometric depiction of an electronic device that is constructed in accordance with illustrative embodiments of this technology.

Turning first to FIG. 1 which is an exploded isometric depiction of an electronic device 100 that is constructed in accordance with illustrative embodiments of the present technology. The electronic device 100 generally has a printed circuit board assembly (PCBA) 102 within a protective enclosure 104. In these illustrative embodiments the PCBA 102 has a substrate (sometimes referred to as circuit board) 106 to which a number of electronic components 108 are attached. The components 108 are electrically connected to each other and ultimately to an electrical connector 110 by electrical traces and vias (not depicted) on the substrate 106.

The enclosure 104 includes a top cover 112. The term "top" is used only in regard to the orientation of the components in these depicted illustrative embodiments in which the top cover 112 is disposed on top of the PCBA 102. That is, alternative embodiments of the enclosure 104 can be constructed or employed with the top cover 112 positioned below the PCBA 102. In short, the term "top" and "bottom" as used in this description are merely for purposes of convenience but only in regard to the depicted orientations with respect to the PCBA 102. The terms "top" and "bottom" are in no way limiting of the claimed embodiments of this technology.

The top cover 112 is placed on one side of the PCBA 102 to provide a protective barrier to the components 108 and the electrical interconnections on the substrate 106. The top cover 112 is also preferably constructed of a rigid material that imparts structural integrity to the PCBA 102, by the way the substrate 106 is supported within the enclosure 104 as described herein. The top cover 112 can advantageously be manufactured by stamping its various features from a relatively high gauge sheet metal material. A couple of labels are depicted as being attached to the top cover 112, and the top cover 112 can be etched or otherwise marked as depicted for proper positioning of the labels.

One of those features in the top cover is a flange 114 that is formed to extend substantially parallel to the substrate 106 to be in direct contact with the substrate 106. That parallel relationship is depicted more clearly below such as in the descriptions of FIG. 4 Note that in these illustrative embodiments the top cover 112 has three such flanges 114, two on one side and one of the other side, although the contemplated embodiments are not so limited. The benefits of the depicted arrangement are discussed further below, but the claimed technology can have more or fewer such flanges 114 than what is depicted in the illustrative embodiments of FIG. 1. The flanges 114 are also sometimes referred to herein as contact flanges.

The enclosure 104 also includes a bottom cover 116 that mates with the top cover 112 to form the protective and strengthening enclosure 104 within which the PCBA 102 is supported. A connecting member couples with each flange 114 in the top cover 112 in order to join the covers 112, 116 together, and to contain both covers 112, 116 against the substrate 106 that is sandwiched therebetween the covers 112, 116. Most generally, the connecting member has opposing planar sides that press toward each other to contain the flange 114 against the substrate 106. In the illustrative embodiments of FIG. 1 the connecting member is a flange 118 formed by the bottom cover 116, and that is configured to mate with the corresponding flange 114 formed by the top cover 112. In these illustrative embodiments each flange 118 is L-shaped before coupling the flanges 114, 118 together. For reference, the top and bottom covers 112, 116 can also be referred to as first and second cover members, respectively. The flanges 118 are also sometimes referred to as crimping flanges.

In these depicted embodiments the bottom cover 116 has three flanges 118, one on one side and two on the other side. Note that like the top cover 112, the bottom cover 116 also has two flanges 114 on one side and one flange 114 on the other side. The covers 112, 116 are arranged so that each of the six flanges 114 couples with a corresponding one of the six flanges 118. In fact, by the arrangement depicted in FIG. 1 the same stamped part can be used for both the top cover 112 and the bottom cover 116 by simply flipping the part. Any other difference in the covers 112, 116 can be provided by modular tooling or secondary operations and the like.

The lateral width between flanges 118 on opposing sides of the bottom cover 116 is sized to admit the PCBA 102 for peripherally supporting the PCBA 102. Other locating features can be used such as bosses 117 in the bottom cover 116 that are sized to closely fit into notches 119 in the substrate 106. The top cover 112 likewise is sized so that the flanges 114 on opposing sides fit between the flanges 118 on opposing sides of the bottom cover 116, and vice versa. After the covers 112, 116 are mated together, each of the flanges 118 can then be crimped to contain the corresponding flange 114 and the substrate 106, thereby joining the covers 112, 116 together with the PCBA 102 compressingly sandwiched therebetween the covers 112, 116.

Figure 2:
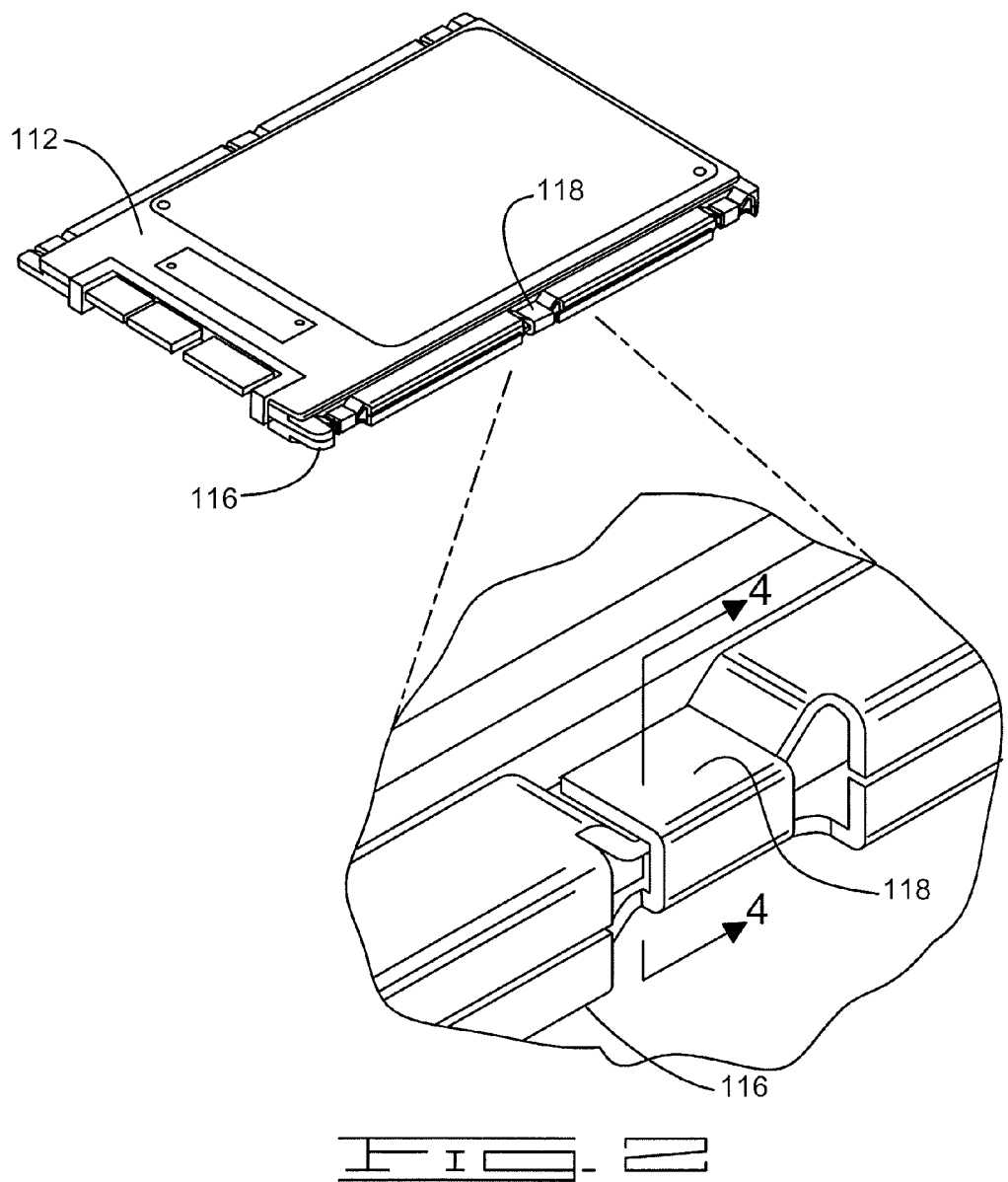
FIG. 2 is an isometric depiction of the electronic device of FIG. 1 with an enlarged detail depiction of one of the crimped connections joining the top and bottom covers together.

FIG. 2 depicts an isometric view similar to FIG. 1 but after the flanges 118 have been crimped around the flanges 114, with the substrate 106 sandwiched therebetween, to join the covers 112, 116 together by six crimped connections. Note that an advantage of the present technology is that the covers 112, 116 are entirely connected by the crimped connections; there is no need for a fastener in this construction. This not only simplifies the manufacturing process, but is also important enabling technology especially with regard to miniaturization where minimum fastener size can constrain further reductions in enclosure size. For purposes of this technology and meaning of the claims the term "fastener-less" is defined as the flange and connecting member technology of the disclosed embodiments that do not require a fastener to join the covers 112, 116 together. This technology expressly does not contemplate previously attempted solutions that require a fastener, such as a screw or a rivet and the like, in addition to the flange and connecting member as disclosed herein.

The following describes more details with respect to just one of the six crimped connections, as depicted in the enlarged detail view, in which the L-shaped flange 118 is formed as a part of the bottom cover 116. However, it will be understood that the following descriptions likewise apply for each of the crimped connections regardless of whether the L-shaped flange 118 is part of the top cover 112 or part of the bottom cover 116.

Figure 3:
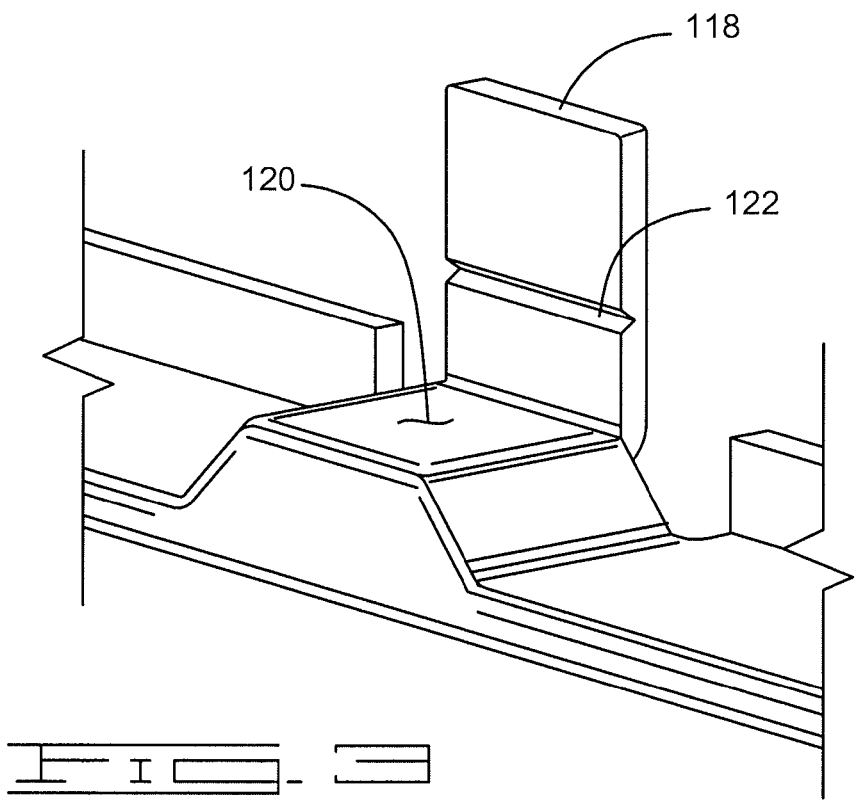
FIG. 3 is an isometric depiction of the bottom cover before the crimping operation is performed to produce the crimped connection depicted in FIG. 2.

FIG. 3 is a reversed enlarged depiction of the flange 118 in the middle of the bottom cover 116 in FIG. 1, before the crimping operation. Although in these depicted embodiments the uncrimped flange 118 is substantially orthogonal to the support surface 120 that contacts the substrate 106 (FIG. 4), the contemplated embodiments are not so limited. In alternative embodiments the uncrimped flange 118 can project at other angles than what is depicted. For example, an angle of more than the depicted ninety degrees can advantageously facilitate placement by effectively funneling the substrate 106 and top cover 112 into the stacked arrangement for the crimping operation.

The flange 118 in these embodiments has a V-shaped groove 122 that reduces the cross sectional thickness of the flange 118 along a predetermined bend line during the crimping operation. The V-shape void advantageously collapses during the crimping operation to form a well-defined and uniform bend line for superior consistent crimping. Further, the V-shape advantageously creates a stress intensification point at the apex of the groove 122. The size of the groove 122 can be set such that an attempt to uncrimp a crimped flange 118 will result in the flange 118 breaking off at the groove 122. That produces a tamper indication feature, a physical feature of the enclosure 104 that is designed to substantiate evidence that someone has attempted to tamper with the electronic device 100, such as to gain access to critical security features in the PCBA 102. The groove 122 tamper indication feature complies with physical security requirements of the federal information processing standard (FIPS) for cryptographic devices.

Figure 4:
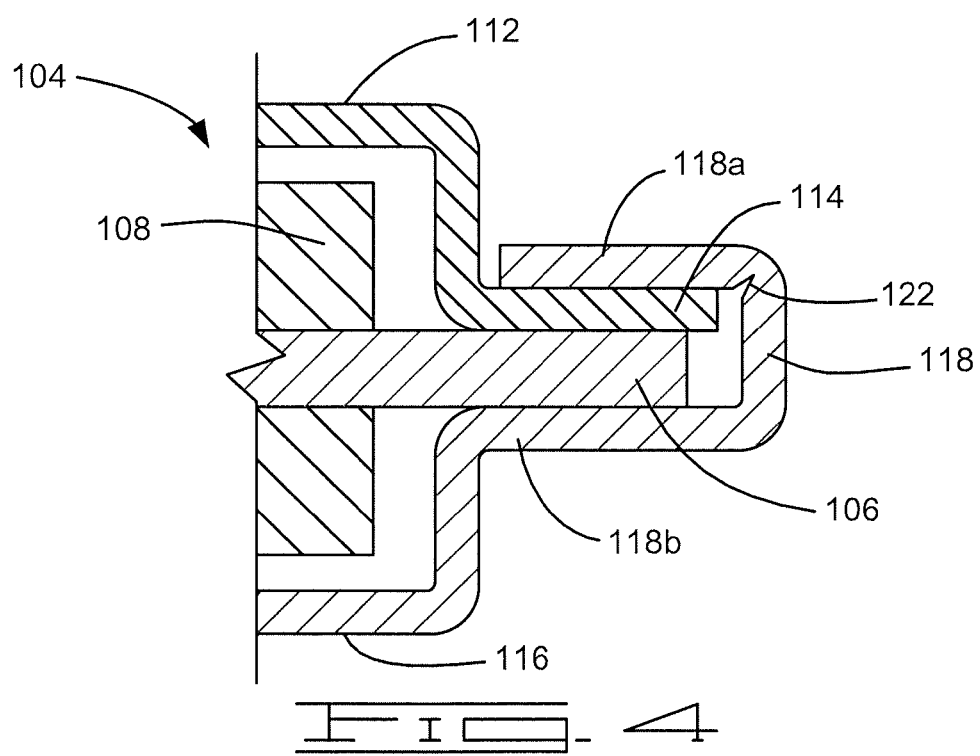
FIG. 4 is a cross sectional depiction of the crimped connection of FIG. 2.

FIG. 4 is a cross sectional depiction taken along the section line 4-4 in the crimped connection of FIG. 2. As mentioned previously, this view better depicts the flange 114 formed in the top cover 112 that extends substantially parallel with the substrate 106 to be in direct contact with the substrate 106. For purposes of this description and meaning of the claims, it will be understood that the flange 114 has a proximal end on the left-hand side as depicted in FIG. 4 that contactingly engages the substrate 106. The top cover 112 also forms a body that is contiguous to the proximal end of the flange 114 but extends away so as to be operably separated from the substrate 106 to provide clearance for containing the components 108 within the enclosure 104. The flange 114 extends longitudinally from the proximal end to a distal end on the right-hand side as depicted in FIG. 4, slightly beyond the edge of the substrate 106 in these illustrative embodiments.

Figure 5:
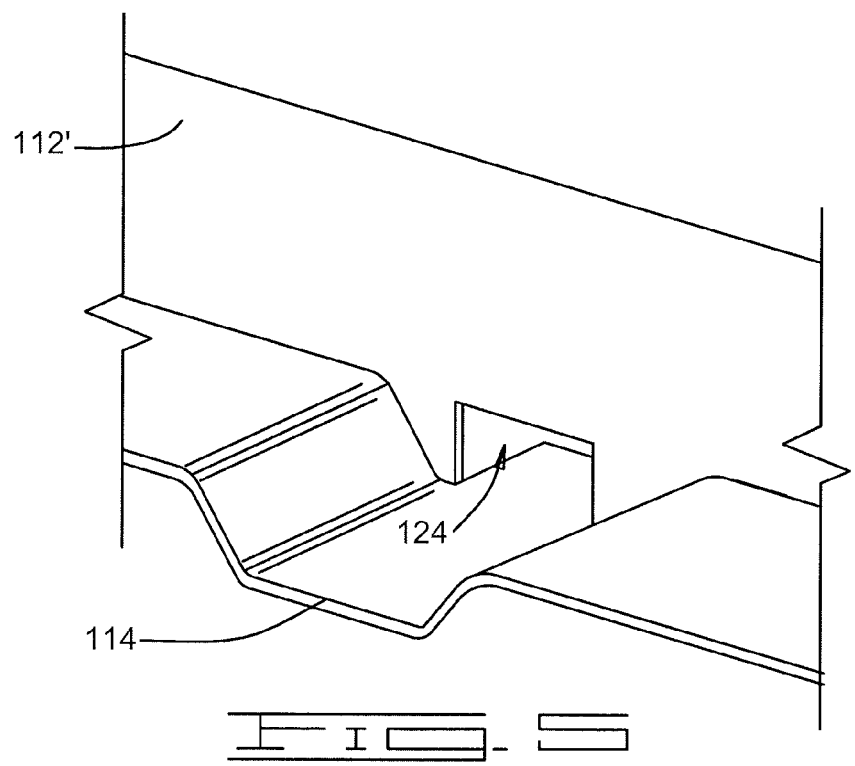
FIG. 5 is an enlarged isometric cutaway depiction of the top cover of FIG. 1 defining an opening.

FIG. 4 more particularly depicts how the flange 118 is crimped to contain the flange 114 (of the top cover 112) against the substrate 106 (of the PCBA 102) within opposing sides 118a, 118b of the flange 118 in order to join the covers 112, 116 together to form the enclosure 104. Note that the flange 114 contactingly engages a top side of the substrate 106 and the flange 118 contacts the bottom side of the substrate 106, such that the crimped connection compressingly sandwiches both the top flange 114 and the substrate 106 between the opposing sides 118a, 118b of the flange 118. This technology advantageously not only provides a FIPS-capable (secure) enclosure, but a secure enclosure that structurally supports the PCBA 102 as well. Importantly, it will be noted that the flange 118 is crimped around both the flange 114 and the substrate 106 instead of crimping the flanges 114, 118 together in mated engagement with each other as in previously attempted solutions. For purposes of this description and meaning of the claims, "crimped together in mated engagement" of the previously attempted solutions means that where the mating flanges contact each other there is an upset feature, such as an indent or a boss and the like, imparted to both flanges to produce same-shape interlocking features creating a seal connecting the flanges directly together with nothing else sandwiched between the seal FIG. 5 depicts alternative embodiments in which a top cover 112' is additionally notched to define an opening 124 adjacent the flange 114. The opening 124 permits crimping the flange 118 into the opening 124 so that a distal end of the flange 118 is unexposed outside the enclosure 104. Shielding the distal end of the flange 118 inside the enclosure 104, unexposed from outside the enclosure 104 where it could otherwise be subjected to a prying force, is another FIPS-capable indication feature of the contemplated embodiments of this technology.

Figure 6:
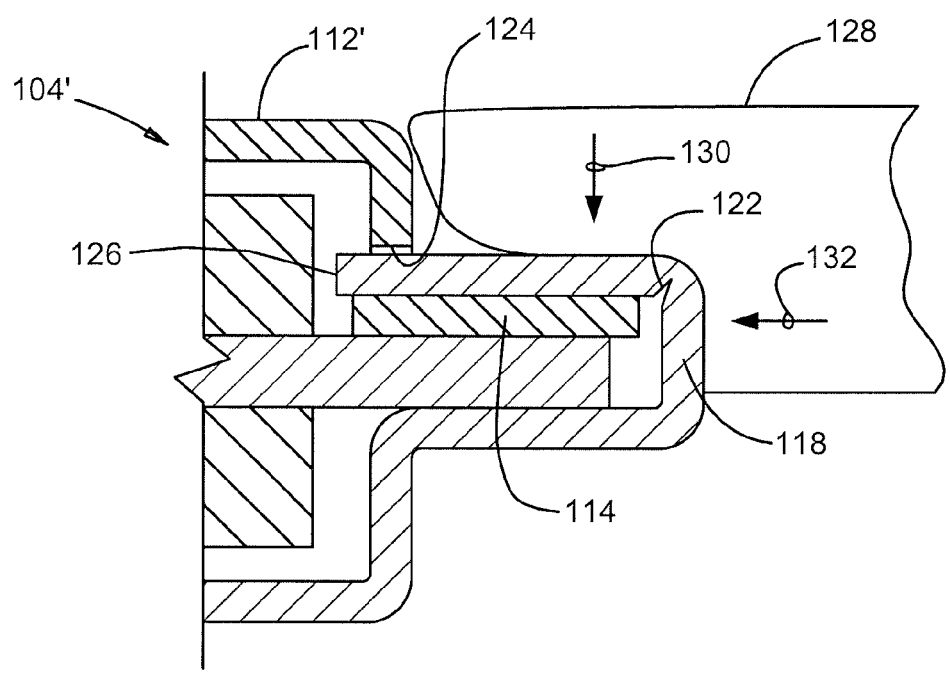
FIG. 6 is similar to FIG. 4 but depicting the bottom cover disposed in the opening in the top cover so that a distal end of the bottom cover is unexposed outside the enclosure.

FIG. 6 is a view similar to FIG. 4 but depicting the top cover 112' defining the opening 124 adjacent the flange 114. The flange 118 is disposed in the opening 124 such that a distal end 126 of the flange 118, when fully crimped as depicted, resides inside the enclosure 104'. That results in the distal end 126 advantageously being unexposed outside the enclosure 104'. An illustrative crimping tool 128 is depicted that reciprocates horizontally (as depicted) to first bend the tab 118 and then apply both a downward crimping force denoted by arrow 130 and a lateral crimping force denoted by arrow 132. Preferably a plurality of crimping tools such as this can be activated simultaneously to crimp all six of the crimped connections in the illustrative embodiments of FIG. 1.

Figure 7:
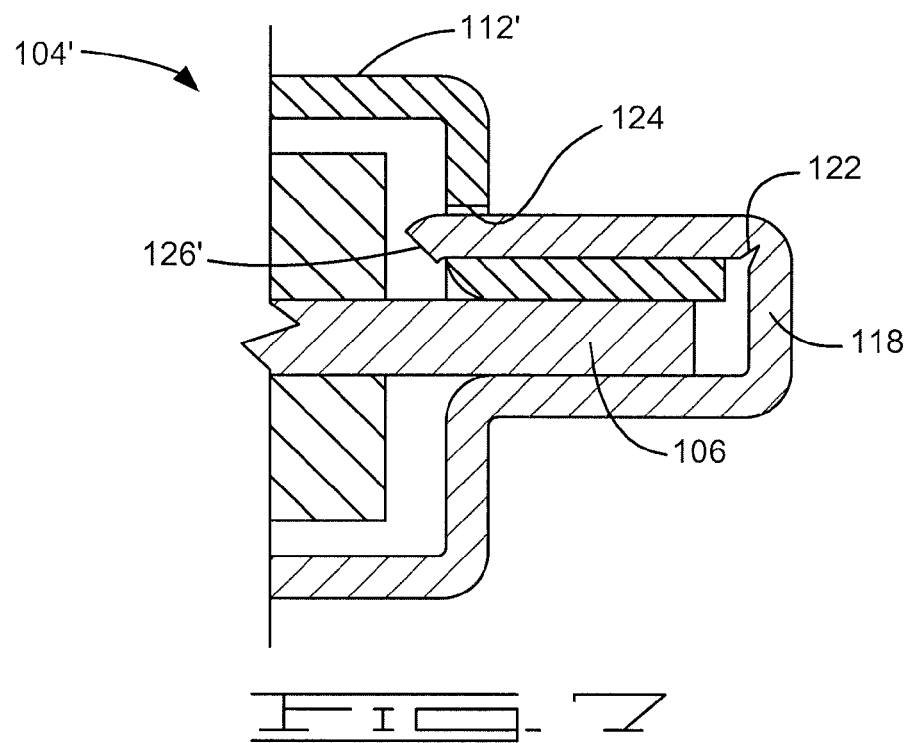
FIG. 7 is similar to FIG. 6 but depicting a locking detent formed at the distal end of the bottom cover.

FIG. 7 is similar to FIG. 6 but additionally depicting a distal end 126' of the flange 118 defining a detent feature that lockingly engages against an edge of the top cover 112' that partially forms the opening 124. This locking engagement of the crimped connection is yet another FIPS-capable tamper indication feature of the contemplated technology.

Figure 8:
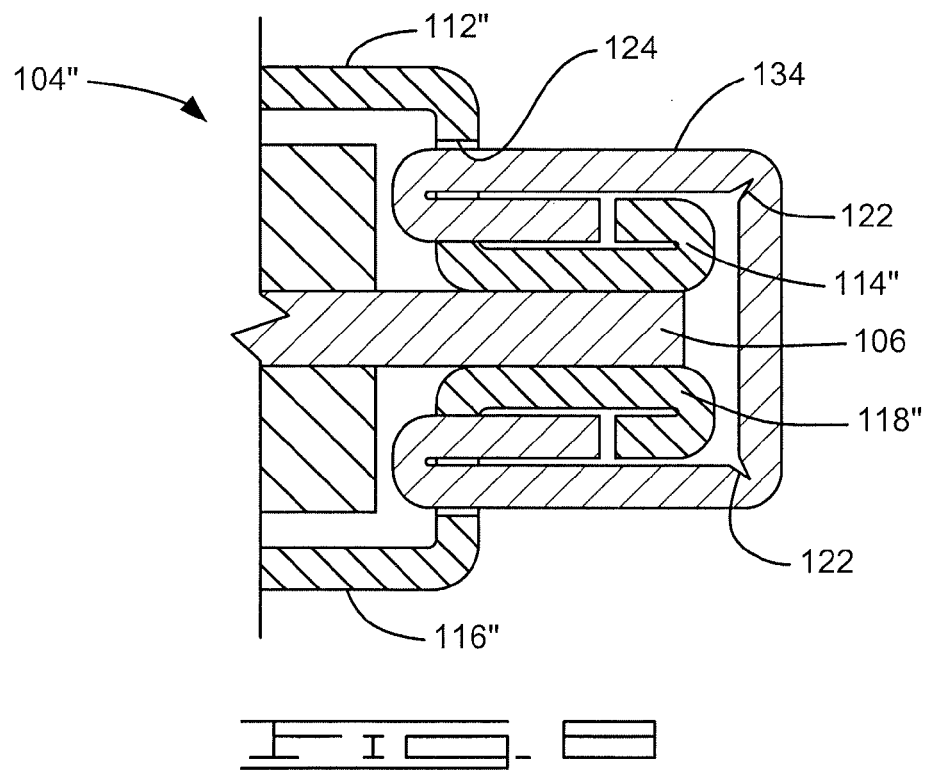
FIG. 8 depicts a spring clip containing the top and bottom covers against the circuit board therebetween.

FIG. 8 depicts an enclosure 104" that is constructed in accordance with alternative embodiments of the claimed technology. The enclosure 104" has a top cover 112" defining a flange 114" that contacts the top side of the substrate 106 as described above. The flange 114" has an end portion that is formed back over on itself, producing a double-material-thickness at the end. The flange 118" of the bottom cover 116" is shaped the same. A spring clip 134 springs open to slide over the double-thickness ends and then springs closed (as depicted) to contain the flange 114" against the substrate 106 within opposing sides of the clip 134 to support the substrate 106 within the enclosure 104". When the clip 134 is fully installed (as depicted), the distal ends of the flanges 114", 118" are substantially coplanar with the respective distal ends of the clip 134, effectively locking the clip 134 in the crimped position. A subsequent attempt to remove the clip 134 is prevented by extending the clip into the opening 124 so that the clip 134 cannot be sprung apart, another FIPS-capable tamper indication feature. Also, the grooves 122 can be formed in the bend lines of the clip 134, as depicted, to provide the FIPS-capable tamper indication feature as discussed above.

The foregoing describes structural details of various illustrative embodiments of the claimed technology. The claimed technology also contemplates a method of constructing an enclosure embodying those structural details. For example, the contemplated methods include placing an electronic component, such as the PCBA 102, on a bottom cover, such as 116. A top cover, such as 112, is then placed on the top side of the electronic component. The covers are then crimped together into a crimped connection so that the covers form an enclosure, such as 104. The top cover contacts the top of the electronic component in the crimped connection and the bottom cover contacts the bottom of the electronic component in the crimped connection. The crimped connection can include the structural details described to make it FIPS-capable, all the while providing a structurally sound support of the electronic component within the enclosure by including the electronic component in the crimped connection.

It is to be understood that even though numerous characteristics and advantages of various embodiments of the described technology have been set forth in the foregoing description, together with the details of the structure and function of various embodiments of the technology, this disclosure is illustrative only, and changes may be made in detail, especially in matters of structure and arrangement of parts within the principles of the described technology to the full extent indicated by the broad general meaning of the terms in which the appended claims are expressed. For example, other types of devices and various arrangements thereof than the specific flange arrangements described are contemplated while still maintaining substantially the same functionality without departing from the scope and spirit of the claimed technology. For example, without limitation, alternative embodiments contemplate one of the covers defining all the crimping flanges (such as 118) and the other cover defining all the crimped flanges (such as 114). For another example, alternative embodiments contemplate a one-piece clamshell enclosure having a foldable hinged side and the closures (coupled flange and connection member) of this technology on the other side. Further, although the illustrative embodiments described herein are directed to electronic devices, and related technology, it will be appreciated by those skilled in the art that the claimed technology can be applied to other devices employing an enclosure as well without departing from the spirit and scope of the described technology.

What is claimed is:

1. An enclosure configured to securely enclose a circuit board, the enclosure comprising:
   a first cover member defining a flange operably extending substantially parallel to a substrate of the circuit board in direct contact with the substrate;
   a second cover member nominally identical to and in facing relationship to the first cover member; and
   a connecting member extending from the second cover member around three different sides of the substrate so that opposing planar sides operably press the flange of the first cover member against the substrate in supporting the circuit board within the enclosure, the connecting member comprises a spring clip which secures the respective first and second flanges in contacting engagement to opposing sides of the circuit board, the spring clip being substantially c-shaped with first and second distal ends that respectively extending through first and second apertures in the first and second cover members.

2. The enclosure of claim 1 wherein the connecting member extending from the second cover member is a first connecting member and the flange of the first cover member is a first flange, wherein the second cover member has a second flange and the first cover member has a second connecting member, and wherein the second connecting member operably presses the second flange against the substrate on a side of the enclosure opposite the first connecting member.

3. The enclosure of claim 1 wherein the flange of the first cover member is a first flange and the second cover member has a second flange in facing relation to the first flange.

4. The enclosure of claim 1 wherein the connecting member comprises a portion of the second cover member, the connecting member in direct contact with the substrate opposite the flange of the first cover member so that an end of the substrate is contactingly sandwiched between the flange and the connecting member.

5. The enclosure of claim 4 wherein the second cover member is crimped around the flange of the first cover member and the circuit board.

6. The enclosure of claim 5 wherein the first cover member comprises a body contiguous to the flange and extending away from the substrate, the body defining an opening adjacent the flange.

7. The enclosure of claim 6 wherein the flange is a first flange and the second cover member defines a second flange, and wherein the second flange is operably disposed in the opening defined by the body adjacent the flange.

8. The enclosure of claim 7 wherein a distal end of the second flange defines a detent that operably lockingly engages the first cover member.

9. The enclosure of claim 4 wherein the first cover member operably contacts one side of the substrate and the second cover member operably contacts the opposing side of the substrate.

10. The enclosure of claim 4 wherein the second cover member defines a tamper indication feature.

11. The enclosure of claim 1 wherein the connecting member defines a tamper indication feature.

12. The enclosure of claim 11 wherein the tamper indication feature defines a groove reducing the cross sectional thickness of the connecting member.

13. The enclosure of claim 12 wherein the groove extends longitudinally along a predetermined bend line of the connecting member.

14. An apparatus comprising:
   a circuit board;
   a first cover having a first contact flange and a first crimping flange; and
   a second cover having a second contact flange and a second crimping flange, the first crimping flange operably crimped to contactingly press the first contact flange against a first end of the circuit board and the second crimping flange operably crimped to contactingly press the second contact flange against an opposing second end of the circuit board to form an enclosure in which the circuit board is disposed.

15. The apparatus of claim 14 wherein the first cover defines an opening adjacent the first contact flange, and wherein a distal end of the second crimping flange extends through the opening.

16. The apparatus of claim 14 wherein a distal end of the second crimping flange defines a detent that operably lockingly engages the first cover.

17. The apparatus of claim 14 wherein the first contact flange operably contacts one side of the circuit board and the second crimping flange operably contacts an opposing side of the circuit board so that the circuit board is contactingly sandwiched between the first contact flange and the second crimping flange.

18. The apparatus of claim 14, wherein the second cover is nominally identical to and in facing relation with the first cover.

19. The apparatus of claim 18, wherein each of the first and second covers has a respective plurality of contact flanges and a corresponding plurality of crimping flanges, with each crimping flange of the second cover crimped onto a corresponding one of the contact flanges of the first cover and each crimping flange of the first cover crimped onto a corresponding one of the contact flanges of the second cover.

* * * * *